(12) United States Patent
Gupta et al.

(10) Patent No.: US 6,380,087 B1
(45) Date of Patent: Apr. 30, 2002

(54) CMP PROCESS UTILIZING DUMMY PLUGS IN DAMASCENE PROCESS

(75) Inventors: Subhash Gupta; Mei Sheng Zhou; Ramasamy Chockalingam, all of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/596,901

(22) Filed: Jun. 19, 2000

(51) Int. Cl.[7] .............................................. H01L 21/302
(52) U.S. Cl. ...................... 438/692; 438/926; 438/691; 438/687; 438/637; 438/627; 438/622
(58) Field of Search ................................ 438/687, 624, 438/619, 622, 627, 637, 691, 926, 692

(56) References Cited

U.S. PATENT DOCUMENTS

| | | | |
|---|---|---|---|
| 5,266,446 A | 11/1993 | Chang et al. | 430/314 |
| 5,445,994 A | 8/1995 | Gilton | 437/183 |
| 5,459,093 A * | 10/1995 | Kuroda et al. | |
| 5,639,697 A | 6/1997 | Weling et al. | 437/225 |
| 5,801,094 A | 9/1998 | Yew et al. | 438/624 |
| 5,885,856 A | 3/1999 | Gilbert et al. | 438/129 |
| 5,888,889 A | 3/1999 | Frisina et al. | 438/545 |
| 6,016,000 A * | 1/2000 | Moslehi | 257/522 |
| 6,057,224 A * | 5/2000 | Bothra et al. | 438/619 |
| 6,124,198 A * | 9/2000 | Moslehi | 438/622 |
| 6,232,662 B1 * | 5/2001 | Saran | 257/750 |
| 6,251,773 B1 * | 6/2001 | Hartswick et al. | 438/631 |

* cited by examiner

Primary Examiner—Caridad Everhart
Assistant Examiner—V. Yevsikov
(74) Attorney, Agent, or Firm—George O. Saile; Rosemary L.S. Pike; Stephen G. Stanton

(57) ABSTRACT

A method of fabricating a semiconductor wafer having at least one integrated circuit, the method comprising the following steps. A semiconductor wafer structure having at least an upper and a lower dielectric layer is provided. The semiconductor wafer structure having a bonding pad area and an interconnect area. At least one active interconnect having a first width is formed in the interconnect area, through the dielectric layers. A plurality of adjacent dummy plugs each having a second width is formed in the bonding pad area, through a portion of the dielectric layers. The semiconductor wafer structure is patterned and etched to form trenches through the upper dielectric layer. The trenches surround each of the at least one active interconnect and the dummy plugs whereby the upper dielectric level between the adjacent dummy plugs is removed. A metallization layer is deposited over the lower dielectric layer, filling the trenches at least to the upper surface of the remaining upper dielectric layer. The metallization layer is planarized to remove the excess of the metallization layer forming a continuous bonding pad within the bonding pad area and including the plurality of adjacent dummy plugs, thus forming at least one damascene structure including the at least one respective active interconnect.

29 Claims, 5 Drawing Sheets

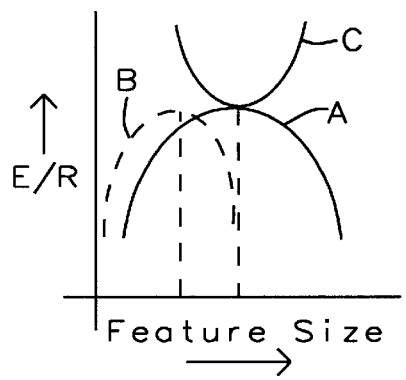
FIG. 7
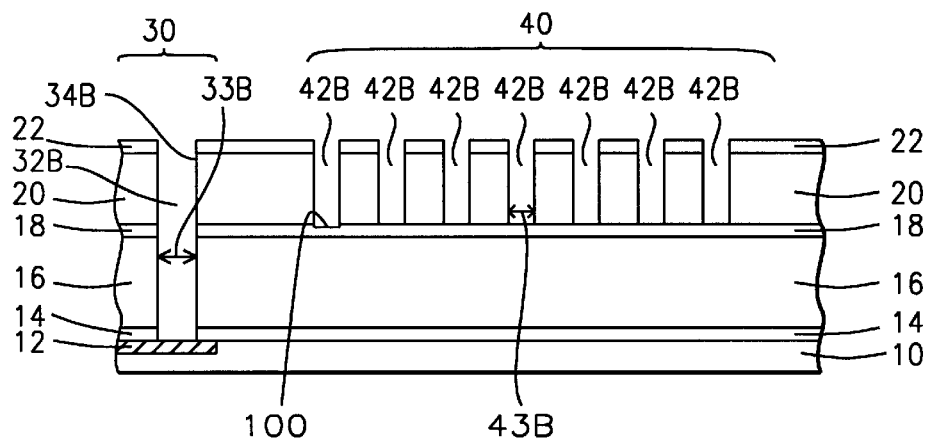
FIG. 8
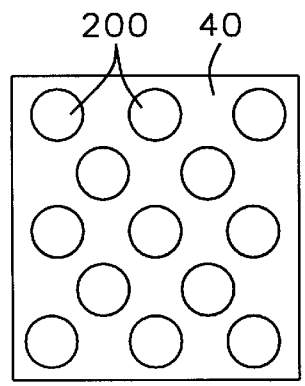　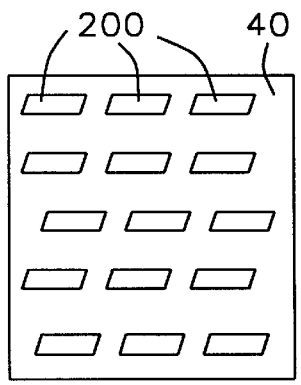　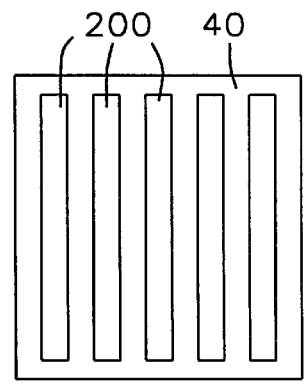
FIG. 9A　　FIG. 9B　FIG. 9C

CM P PROCESS UTILIZING DUMMY PLUGS IN DAMASCENE PROCESS

BACKGROUND OF THE INVENTION

Copper damascene and dual damascene structures are beginning to be used for interconnects. The damascene processing uses chemical mechanical polishing (CMP) to planarize the top surface of the copper interconnect. However dishing is a problem with CMP.

U.S. Pat. No. 5,885,856 to Gilbert et al. describes a method of forming an integrated circuit with dummy mesas added to the layout pattern of the integrated circuit to equilibrate the polishing rate across the surface of a semiconductor substrate. The location of each dummy mesa is selected to that it does not intersect a well boundary or an active region, and does not fall under a conductive layer or polysilicon or interconnect structure.

U.S. Pat. No. 5,639,687 to Weling et al. describes a method of commonizing the pattern density of topography for different layers of semiconductor wafers to improve the chemical mechanical polishing processing of the wafer. Dummy raised lines are inserted as necessary into gaps between active conductive traces on a trace layer on the wafer.

U.S. Pat. No. 5,445,994 to Gilton describes a method for forming planar metal connections to the bonding pads of a semiconductor die that can be customized to match different bonding pad and lead finger configuration U.S. Pat. No. 5,888,889 to Frisina et al. describes a process for manufacturing an integrated structure pad assembly for wire bonding to a power semiconductor device chip.

U.S. Pat. No. 5,801,094 to Yew et al. describes a dual damascene process that forms a two level metal interconnect structure with a step free transition between the two levels.

U.S. Pat. No. 5,266,446 to Chang et al. describes a method of fabricating a planar multilayer thin film structure on the surface of a dielectric substrate by applying and first and second layer of dielectric polymeric material on a surface of a dielectric substrate. The second, upper layer of polymeric material is photosensitive and is exposed and developed to form a feature therein that is in communication with a feature in the first, lower layer of polymeric material. A seed layer is deposited over the second layer, and coating the first and second layer features. A thicker layer of conductive material is deposited over the seed layer, filling the first and second features at least to the level of the second layer, and is then planarized to remove the excess of the thicker layer.

SUMMARY OF THE INVENTION

Accordingly, it is an object of the present invention to provide a method of forming metal dummy plugs and active interconnects in a single etch step in a semiconductor structure.

Another object of the present invention is to provide a method of forming metal dummy plugs, in a bonding pad area, and active interconnects, in an interconnect area, in a single etch step in a interconnect area in a semiconductor structure.

A further object of the present invention is to provide a copper chemical-mechanical polishing process utilizing dummy plugs in damascene processes that minimize the erosion of the metal layer from large areas.

Yet another object of the present invention is to provide a copper chemical-mechanical polishing process utilizing dummy plugs that minimizes copper dishing during in large areas, e.g. bonding pad areas.

Other objects will appear hereinafter.

It has now been discovered that the above and other objects of the present invention may be accomplished in the following manner. Specifically, semiconductor wafer structure having at least an upper and a lower dielectric layer is provided. The semiconductor wafer structure having a bonding pad area and an interconnect area. At least one active interconnect having a first width is formed in the interconnect area, through the dielectric layers. A plurality of adjacent dummy plugs each having a second width is formed in the bonding pad area, through a portion of the dielectric layers. The semiconductor wafer structure is patterned and etched to form trenches through the upper dielectric layer. The trenches surround each of the at least one active interconnect and the dummy plugs whereby the upper dielectric level between the adjacent dummy plugs is removed. A metallization layer is deposited over the lower dielectric layer, filling the trenches at least to the upper surface of the remaining upper dielectric layer. The metallization layer is planarized to remove the excess of the metallization layer forming a continuous bonding pad within the bonding pad area and including the plurality of adjacent dummy plugs, thus forming at least one damascene structure including the at least one respective active interconnect.

BRIEF DESCRIPTION OF THE DRAWINGS

The features and advantages of the method of fabricating a semiconductor structure having at least one integrated circuit according to the present invention will be more clearly understood from the following description taken in conjunction with the accompanying drawings in which like reference numerals designate similar or corresponding elements, regions and portions and in which:

FIGS. 1, 2A–6A, and 1, 2B–6B schematically illustrate in cross-sectional representation alternate embodiments, respectively, of the present invention.

FIG. 7 is a graph plotting etch rate (E/R) versus feature size in forming trenches in silicon oxide layers for various etch chemistries.

FIG. 8 is an option to the second embodiment of the present invention.

FIGS. 9A–9C schematically illustrate in plan view, example dummy plug patterns inside the bonding pad, or large area, of the present invention.

DETAILED DESCRIPTION OF THE PREFERRED EMBODIMENT

Figure 1:
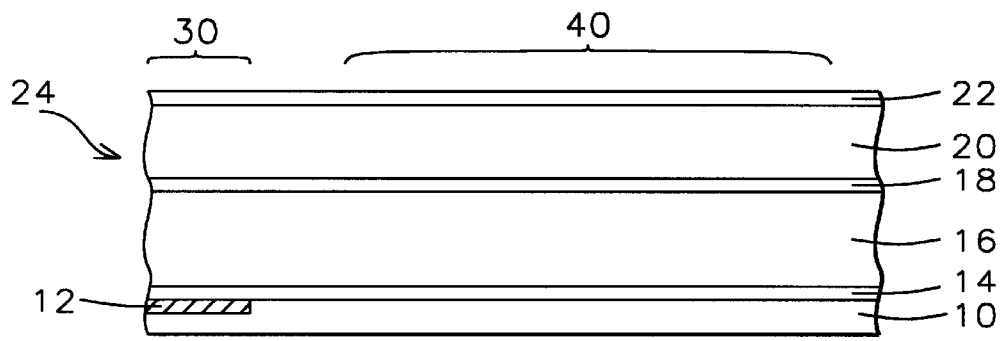

Accordingly as shown in FIG. 1, common to both embodiments of the present invention, starting semiconductor structure 10 includes an upper intermetal dielectric layer (IMD) having at least one exposed active device 12 and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. Alternatively, semiconductor structure 10 can be a semiconductor substrate, e.g. a wafer, with an active area 12. Dielectric layer 16 can represent can IMD and /or ILD layers. The term "semiconductor structure" is meant to include devices formed within a semiconductor wafer and the layers overlying the wafer.

Active device 12 can represent a conductive line/interconnect in a dielectric layer. Also, active device 12 can represent a doped region in a silicon substrate.

Unless otherwise specified, all structures, layers, etc. may be formed or accomplished by conventional methods known in the prior art.

Semiconductor structure etch stop layer (bottom etch stop layer) 14 is formed over semiconductor structure 10 and active device 12. Lower interlayer dielectric (ILD) layer 16 is formed over lower etch stop layer 14. Lower etch stop layer (middle etch stop layer) 18 is formed over lower ILD layer 16. Upper interlayer dielectric (ILD) layer 20 is formed over lower etch stop layer 18, and upper etch stop layer (top etch stop layer) 22 is formed over upper ILD 20. This forms semiconductor wafer structure 24.

Etch stop layers 14, 18, 22 may be formed from SiC (carbonated $SiO_2$), $Si_3N_4$, or $SiO_2$ in the case of organic low-k materials such as dielectrics, and are preferably formed of silicon nitride ($Si_3N_4$). Bottom etch stop layer 14 may be is from about 150 to 1500 Å thick; middle etch stop layer 18 may be from about 0 to 1500 Å thick; and top etch stop layer 22 may be from about 150 to 1500 Å thick.

ILD layers 16, 20 may be formed from $SiO_2$, low-k materials such as SILK™ (resembles BCB in its composition except that it does not contain silicon and has a dielectric constant of about 2,6—that is, it is a carbonaceous polymer—available from Dow Chemical Corp.), FLARE™ (fluorinated poly (arylene ether)—available from Allied Signal Corp.), BLACK DIAMOND™ (fluorosilicate glass—available from Applied Materials), or CORAL™ (carbon doped silicon dioxide—available from Novellus Corporation), etc., and are preferably formed from silicon oxide ($SiO_2$). ILD layers 16, 20 may each be from about 1500 to 15,000 Å thick.

Semiconductor wafer structure 24 includes interconnect area 30 and bonding pad area 40. Bonding pad area 40 may be any large area, or in simplest terms, a large area is any area that can have at least one dummy plug. Bonding pads comprise the typical 'large area.'

Active device 12, e.g. a conductive line, is within interconnect area 30.

The two embodiments shown in FIGS. 2A–6A and FIGS. 2B–6B, respectively, may then be formed from the semiconductor wafer structure 24 of FIG. 1. In both embodiments, at least one via opening 34A, 34B is formed within interconnect area 30 in a single etch step with dummy plug openings 42A, 42B within bonding pad area 40.

The structural difference between the two embodiments is that in the first embodiment (FIGS. 2A–6A) the width 33A of via opening 34A for active interconnect 32A is less than the width 43A of dummy plug openings 42A for dummy plugs 46A. While in the second embodiment (FIGS. 2B–6B) the width 33B of via opening 34B for active interconnect 32B is greater than the width 43B of dummy plug openings 42B for dummy plugs 46B.

First Embodiment

Figure 2A:
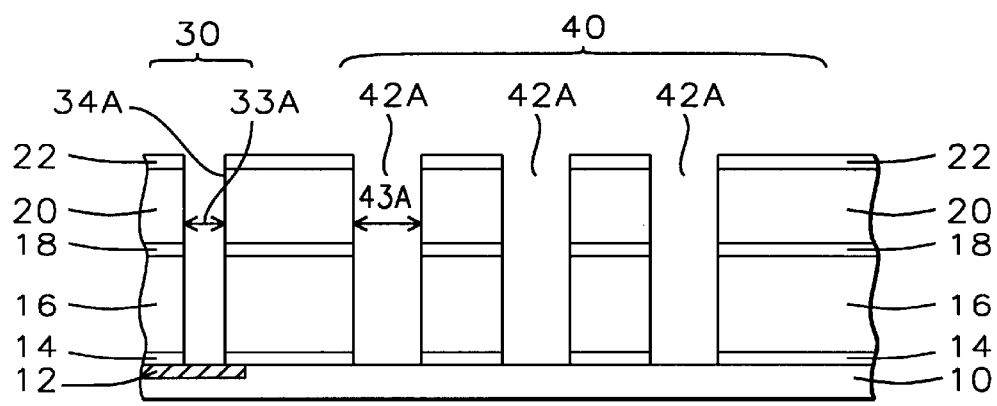

As shown in FIG. 2A, semiconductor wafer structure 24 is patterned and etched, in a single etch step, to form at least one via opening 34A within interconnect area 30 exposing active device 12, and equally spaced-apart dummy plug openings 42A within bonding pad area 40.

An etching process is selected that etches more narrow openings more rapidly than wider openings. The reactive ion etch (RIE) for silicon dioxide may have the characteristics as shown in FIG. 7, depending upon etch process chemistry. That is, plotting etch rate (E/R) on the vertical axis versus feature size on the horizontal axis produces a bell shaped curve with a maximum etch rate for a particular feature size, i.e. a particular width of trenches being etched. By altering the etch process chemistry may shift bell curve A for the first embodiment to the left to bell curve B for the second embodiment, i.e. having the maximum etch rate for narrower trench size. Thus it may be possible to shift the bell curve on the horizontal axis (curve B) or invert the bell curve (curve C) by altering the etch process chemistry.

The single step etching process of the first embodiment etches the more narrow via opening 34A of active interconnect 32A more rapidly than the wider dummy plug openings 42A because of the reverse RIE (reactive ion etch) lag effect. That is, wider, open areas are etched slower due to by products reducing the concentration of the etch species.

Via opening 34A extends through etch stop layers 14, 18, 22 and ILD layers 16, 20, exposing active device 12. Width 33A (or "f") of via opening 34A is preferably less than about 4000 Å. The lower end of width 34A is limited by the process capabilities. Via opening 34A allows electrical coupling associated elements of an associated integrated circuit on semiconductor wafer 10, i.e., e.g., active device 12.

Dummy plug openings 42A may be etched through upper etch stop layer 22, upper ILD layer 20, lower etch stop layer 18, and partially within lower ILD layer 16 (to a depth of preferably from about 1000 to 8000 Å). Dummy plug openings 42A are etched so that the subsequently formed dummy plugs and bonding pad will not electrically couple with any associated elements of any associated integrated circuit on the semiconductor wafer.

Dummy plug openings 42A are preferably from about 2000 to 16,000 Å deep. Width 43A (>2 f) of dummy plug openings 42A is preferably less than about 8000 Å. The lower end of width 43A is limited by the process capabilities.

With the width of via opening 34A equal to "f," then the width of wider dummy plug openings 42A are greater than about twice the width "f" of via opening 34A, i.e. the width of dummy plug openings 42A are about >2 f.

Or, width 33A of via opening 34A is less than width 43A of dummy plug openings 42A by about 50% or more.

An optional first barrier layer (not shown) may be formed within, and lining, via opening 34A and also within, and lining, dummy plug openings 42A. The barrier layer may be comprised of TaN or Ta, and may comprise a lower barrier layer portion and an upper metal seed layer portion.

Figure 3A:
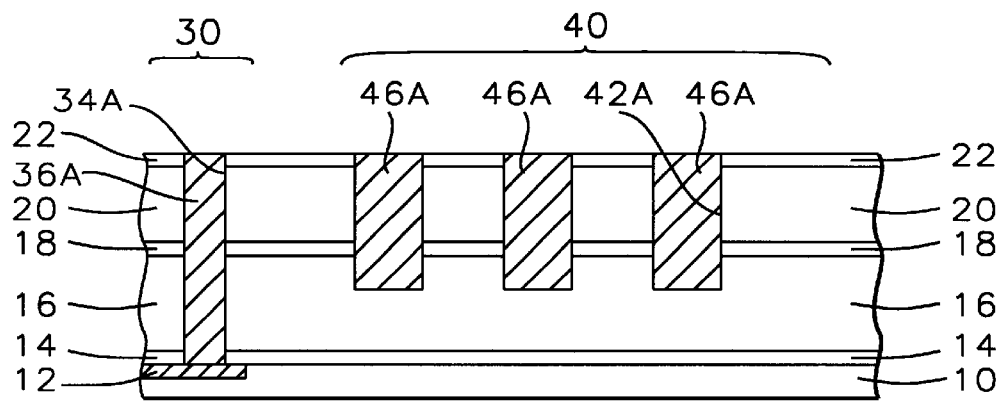

As shown in FIG. 3A, a metal layer (not shown) is deposited over the structure, filling via opening 34A and dummy plug openings 42A at least as high as upper etch stop layer 22. The metal layer is then planarized, preferably by chemical mechanical polishing, to form metal plug 36A within interconnect area 30 and dummy plugs 46A within bonding pad area 40. The metal layer and metal plug 36A and dummy plugs 46A may be comprised of copper (Cu), or aluminum (Al) and preferably tungsten (W).

Figure 4A:
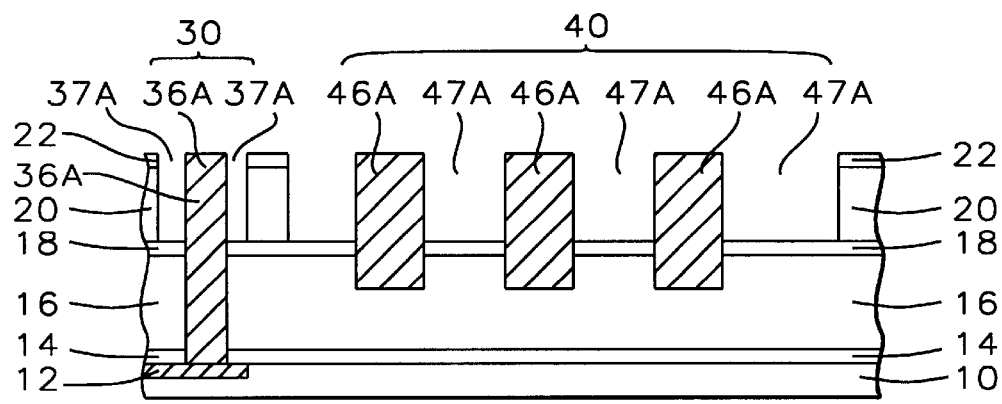

As shown in FIG. 4A, the structure is patterned and upper etch stop layer 22 and upper ILD layer 20 are etched to lower etch stop layer 18 to form trenches 37A, e.g. line trenches, adjacent tungsten metal plug 36A and trenches 47A adjacent tungsten dummy plugs 46A. Lower etch stop layer 18 forms the bottoms of trenches 37A, 47A. It is noted that despite any difference in widths between trenches 37A and trenches 47A, both sets of trenches 37A, 47A are only etched to lower etch stop layer 18.

All of upper etch stop layer 22 and upper ILD layer 20 are removed between adjacent tungsten dummy plugs 46A in forming trenches 47A.

An optional second barrier layer 79A may be formed within, and lining, trenches 37A and also within, and lining, trenches 47A. Barrier layer 79A may comprise a lower barrier layer portion and an upper metal seed layer portion.

Figure 5A:
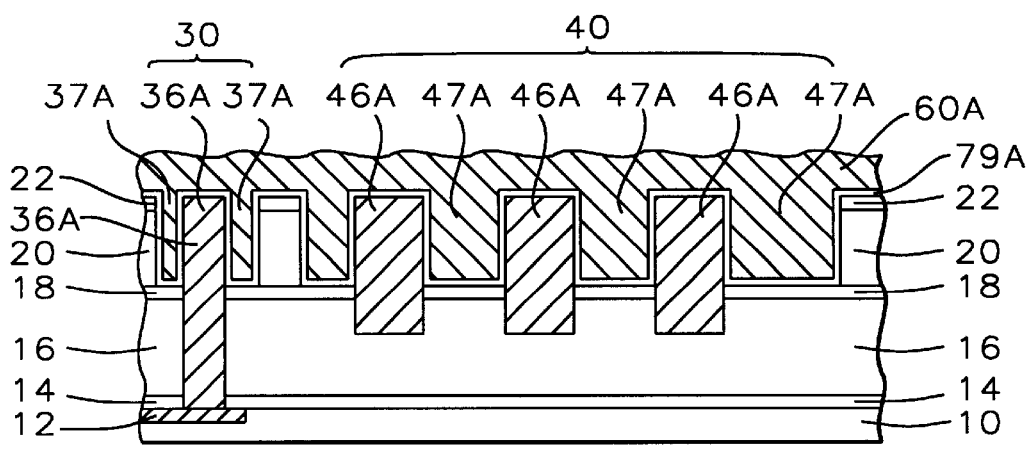

As shown in FIG. 5A, metallization layer 60A is deposited over the structure, filling trenches 37A adjacent tungsten metal plug 36A and trenches 47A adjacent tungsten dummy plugs 46A at least as high as upper etch stop layer 22. Metallization layer 60A may be composed of tungsten (W), aluminum (Al), an aluminum alloy, or copper, and preferably copper (Cu).

Figure 6A:
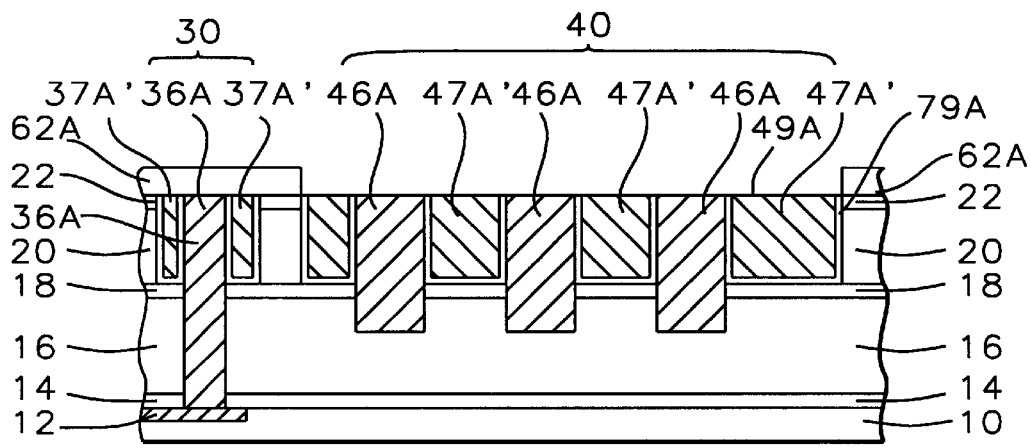

As shown in FIG. 6A, copper layer 60A is planarized, preferably by CMP, to remove the excess copper metal and to form: planarized dual damascene structure 39A, within interconnect area 30, comprised of tungsten metal plug 36A and copper metal filled trenches 37A'; and continuous planarized bonding pad 49A, within bonding pad area 40, comprised of tungsten dummy plugs 47A' and copper metal filled trenches 47A'.

A planarized passivation layer 62A is deposited over the structure and is patterned to expose continuous bonding pad 49A within bonding pad area 40. Passivation layer 62A may be comprised of silicon nitride, SiC, $SiO_2$, or SOG for example.

Second Embodiment

Figure 2B:
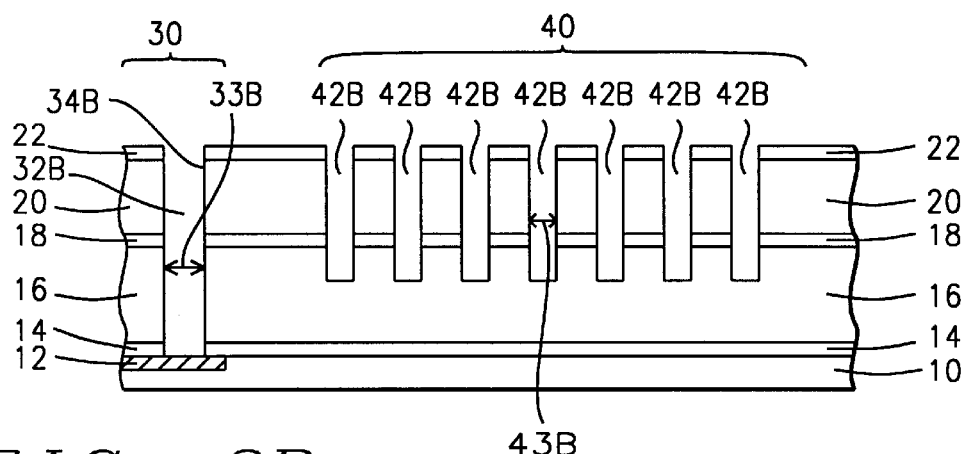

As shown in FIG. 2B, semiconductor wafer structure 24 is patterned and etched, in a single etch step, to form at least one via opening 34B within interconnect area 30 exposing active device 12, and equally spaced-apart dummy plug openings 42B within bonding pad area 40.

An etching process is selected that etches more narrow openings more rapidly than wider openings. During the etch process, more by-products are created in the wider openings (via opening 34B). This affects the concentration of etch species and thus the etch rate is reduced in the wide openings (via opening 34B) versus the narrow openings (dummy plug openings 42B). For example, a chemistry for etching may include $C_4F_8/Co/O_2/Ar$.

The single step etching process of the second embodiment etches the wider via opening 34B of active interconnect 32B more rapidly than the more narrow dummy plug openings 42B because of the RIE lag or micro loading effect as noted above.

Via opening 34B extends through etch stop layers 14, 18, 22 and ILD layers 16, 20, exposing active device 12. Width 33B of via opening 34B is preferably less than about 8000 Å. The lower end of width 34B is limited by the process capabilities. Via opening 34B allows electrical coupling associated elements of an associated integrated circuit on semiconductor wafer 10, i.e., e.g., active device 12.

Dummy plug openings 42B may be etched through upper etch stop layer 22, upper ILD layer 20, lower etch stop layer 18, and partially within lower ILD layer 16 (to a depth of preferably from about 1000 to 8000 Å). Dummy plug openings 42B are etched so that the subsequently formed dummy plugs and bonding pad will not electrically couple with any associated elements of any associated integrated circuit on the semiconductor wafer.

Dummy plug openings 42B are preferably from about 3000 to 16,000 Å deep. Width 43B of dummy plug openings 42B is preferably less than about 4000 Å. The lower end of width 43B is limited by the process capabilities.

Width 43B of dummy plug openings 42B is less than width 33B of via opening 34B by about 80% or less.

An optional first barrier layer (not shown) may be formed within, and lining, via opening 34B and also within, and lining, dummy plug openings 42B. The barrier layer may be comprised of TaN or Ta, and may comprise a lower barrier layer portion and an upper metal seed layer portion.

Figure 3B:
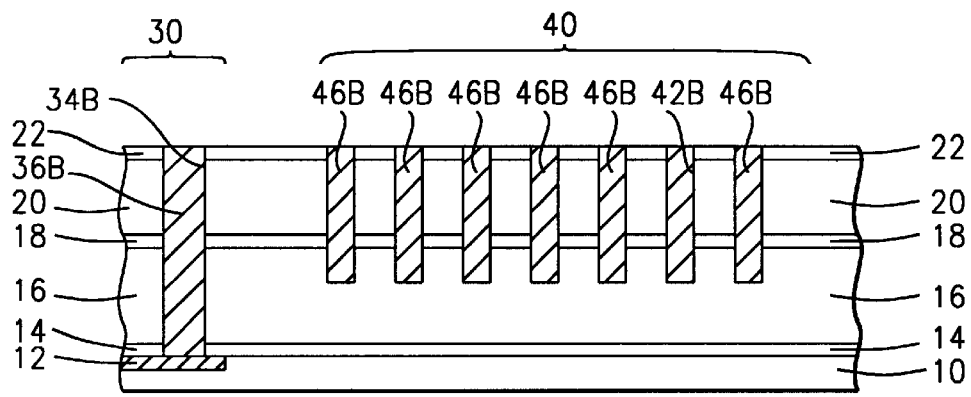

As shown in FIG. 3B, a metal layer (not shown) is deposited over the structure, filling via opening 34B and dummy plug openings 42B at least as high as upper etch stop layer 22. The metal layer is then planarized, preferably by chemical mechanical polishing, to form metal plug 36B within interconnect area 30 and dummy plugs 46B within bonding pad area 40. The metal layer and metal plug 36B and dummy plugs 46B may be comprised of copper (Cu), or aluminum (Al) and preferably tungsten (W).

Figure 4B:
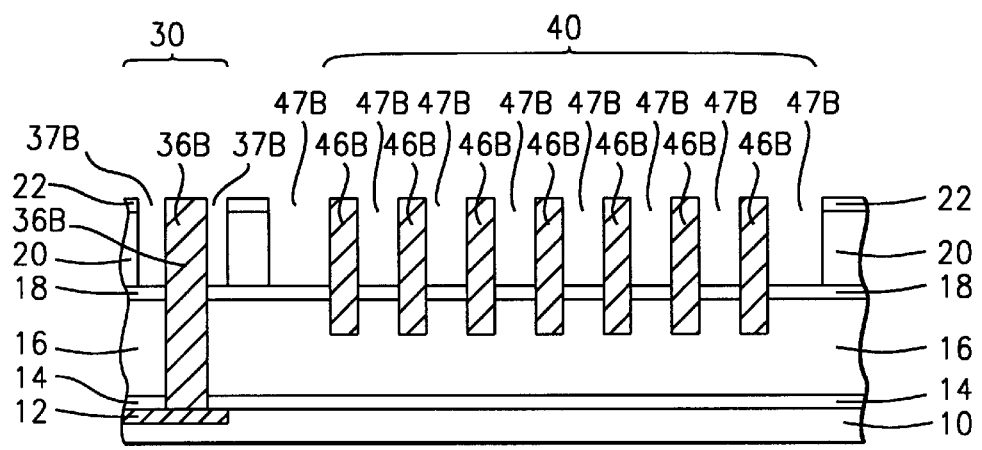

As shown in FIG. 4B, the structure is patterned and upper etch stop layer 22 and upper ILD layer 20 are etched to lower etch stop layer 18 to form trenches 37B, e.g. line trenches, adjacent tungsten metal plug 36B and trenches 47B adjacent tungsten dummy plugs 46B. Lower etch stop layer 18 forms the bottoms of trenches 37B, 47B. It is noted that despite any difference in widths between trenches 37B and trenches 47B, both sets of trenches 37B, 47B are only etched to lower etch stop layer 18.

All of upper etch stop layer 22 and upper ILD layer 20 are removed between adjacent tungsten dummy plugs 46B in forming trenches 47B.

An optional second barrier layer 79B may be formed within, and lining, trenches 37B and also within, and lining, trenches 47B. Barrier layer 79B may comprise a lower barrier layer portion and an upper metal seed layer portion.

Figure 5B:
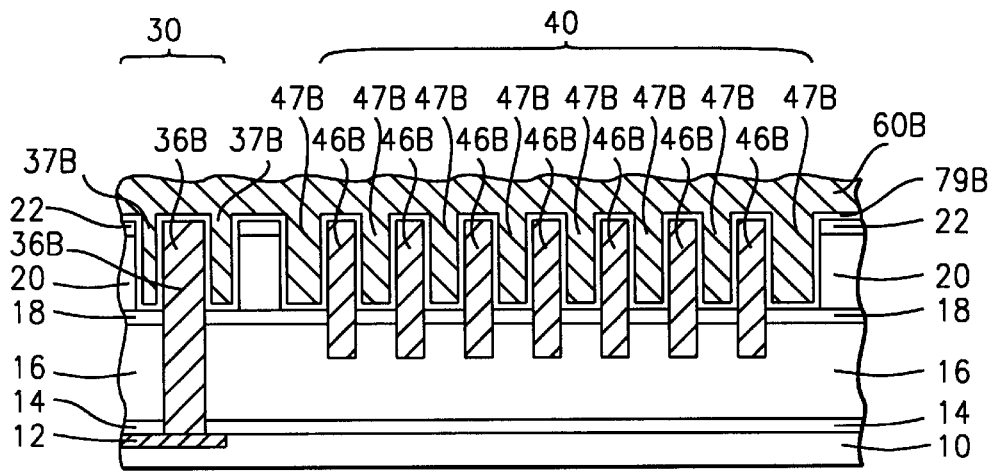

As shown in FIG. 5B, metallization layer 60B is deposited over the structure, filling trenches 37B adjacent tungsten metal plug 36B and trenches 47B adjacent tungsten dummy plugs 46B at least as high as upper etch stop layer 22. Metallization layer 60B may be composed of tungsten (W), aluminum (Al), an aluminum alloy, or copper (Cu), and preferably copper (Cu).

Figure 6B:
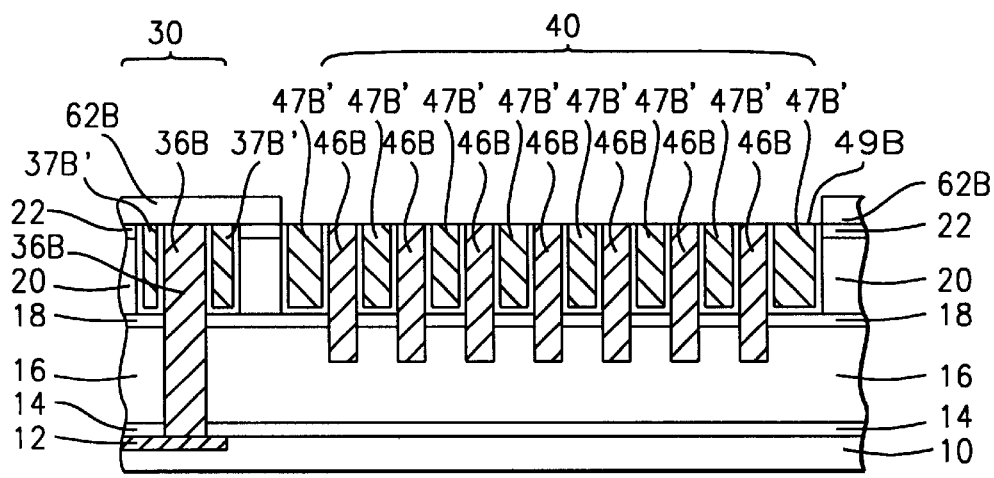

As shown in FIG. 6B, copper layer 60B is planarized, preferably by CMP, to remove the excess copper metal and to form: planarized dual damascene structure 39B, within interconnect area 30, comprised of tungsten metal plug 36B and copper metal filled trenches 37B'; and continuous planarized bonding pad 49B, within bonding pad area 40, comprised of tungsten dummy plugs 47B' and copper metal filled trenches 47B'.

A planarized passivation layer 62B is deposited over the structure and is patterned to expose continuous bonding pad 49B within bonding pad area 40. Passivation layer 62B may be comprised of silicon nitride, SiC, $SiO_2$, or SOG for example.

Optional Structure for the Second Embodiment

FIG. 8 illustrates an optional structure for the second embodiment. When the lithographic process is optimized for via openings 32B (nominal feature size), the smaller dummy plug openings 42B will be patterned even smaller than the designed size due to the nature of optics. Subsequently, when etching is completed for via openings 32B, middle etch stop layer 18 delineates the bottom of dummy plug openings 42B at 100, and dummy plug openings 42B are less wide.

That is, the dummy plug openings 42B are etched only down to middle etch stop layer 18 as at 100. The structure of FIG. 8 would substitute for the structure of FIG. 2B with processing otherwise continuing as described above with the difference being in the depth of dummy plug openings 42A as shown in FIG. 8.

The following are some of the advantages of the present invention:
1. The method of the present invention gives better control on dishing and erosion performance on the CMP process.
2. Another major advantage is that the method of forming the bonding pad in accordance with the present invention allows the bonding pad to better adhere to the underlying dielectric layers due to dummy metal plugs 46A, 46B.

It is noted that the patterns 200 of dummy plugs 46A, 46B inside the bonding pad, or large, area 40 may be of any shape such as circular, trapezoidal, or trench as illustrated in FIGS. 9A–9C, respectively.

While particular embodiments of the present invention have been illustrated and described, it is not intended to limit the invention, except as defined by the following claims.

We claim:

1. A method of fabricating a semiconductor wafer having at least one integrated circuit, the method comprising the steps of:

providing a semiconductor wafer structure having at least an upper and a lower dielectric layer; said semiconductor wafer structure having a bonding pad area and a interconnect area;

forming, at least one active interconnect having a first width, in said interconnect area, through said dielectric layers, and a plurality of adjacent dummy plugs each having a second width, in said bonding pad area, through a portion of said dielectric layers;

patterning and etching said semiconductor wafer structure to form trenches through said upper dielectric layer; said trenches surrounding each of said at least one active interconnect and said dummy plugs whereby said upper dielectric level between said adjacent dummy plugs is removed;

depositing a metallization layer over said lower dielectric layer, filling said trenches at least to the upper surface of the remaining upper dielectric layer; and planarizing said metallization layer to remove the excess of said metallization layer forming a continuous bonding pad within said bonding pad area and including said plurality of adjacent dummy plugs; and forming at least one damascene structure including said at least one respective active interconnect.

2. The method of claim 1, wherein said at least one active interconnect is arranged to electrically couple associated elements of an associated integrated circuit on the wafer, and said dummy plugs are not arranged to electrically couple any associated elements of any associated integrated circuit on the wafer.

3. The method of claim 1, wherein said first width of each said active interconnect is less than said second width of each said dummy plug.

4. The method of claim 1, wherein said first width of each said active interconnect is greater than said second width of each said dummy plug.

5. The method of claim 1, wherein said dielectric layers are comprised of a material selected from the group silicon oxide, FSG, and low-k materials such as fluorinated poly (arylene ether); and including the step of forming a passivation layer at least over said continuous bonding pad; said passivation layer being comprised of a material selected from the group silicon nitride, SiC, and $SiO_2$.

6. The method of claim 1, wherein said active interconnect and said dummy plugs are comprised of a metal selected from the group tungsten, copper, and aluminum; and said metallization layer is comprised of a material selected from the group copper, tungsten, aluminum, and an aluminum alloy.

7. The method of claim 1, wherein said active interconnect and said dummy plugs are comprised of tungsten and said metallization layer is comprised of copper.

8. The method of claim 1, wherein said dielectric layers are comprised of a material selected from the group silicon oxide, FSG, and low-k materials such as fluorinated poly (arylene ether); said active interconnect and said dummy plugs are comprised of a metal selected from the group tungsten, copper, and aluminum; and said metallization layer is comprised of a material selected from the group copper, tungsten, aluminum, and an aluminum alloy; and including the step of forming a passivation layer at least over said continuous bonding pad; said passivation layer being comprised of a material selected from the group silicon nitride, SiC, and $SiO_2$.

9. The method of claim 1, wherein said dielectric layers are comprised of silicon oxide; said passivation layer is comprised of silicon nitride; said active interconnect and said dummy plugs are comprised of tungsten; and said metallization layer is comprised of copper.

10. The method of claim 1, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step.

11. The method of claim 1, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step; wherein said barrier layer includes a barrier layer portion and a seed layer portion over said barrier layer portion.

12. The method of claim 1, wherein said metal layer planarization step is conducted by chemical mechanical polishing.

13. A method of fabricating a semiconductor wafer having at least one integrated circuit, the method comprising the steps of:

providing a semiconductor structure having an upper surface with a semiconductor structure etch stop layer over said upper surface, a lower dielectric layer over said semiconductor structure etch stop layer, a lower etch stop layer over said lower dielectric layer, an upper dielectric layer over said upper etch stop layer, and an upper etch stop layer over said upper dielectric layer; said semiconductor structure having a bonding pad area and a interconnect area;

forming, in a single etch step, at least one active interconnect, each having a first width, in said interconnect area through said upper etch stop layer, upper dielectric, lower etch stop layer, lower dielectric, and semiconductor wafer etch stop layer, and a plurality of adjacent dummy plugs, each having a second width, in said bonding pad area and through said upper etch stop layer, upper dielectric and lower etch stop layers and at least partially into said lower dielectric; said at least one active interconnect being arranged to electrically couple associated elements of an associated integrated circuit on the wafer, and said dummy plugs not being arranged to electrically couple any associated elements of any associated integrated circuit on the wafer;

patterning and etching said semiconductor structure to form trenches through said upper etch stop layer and said upper dielectric layer to said lower etch stop layer; said trenches surrounding each of said at least one active interconnect and said dummy plugs whereby said upper etch stop layer and said upper dielectric level between said adjacent dummy plugs is removed;

depositing a metallization layer over said etched upper etch stop layer and said upper dielectric layer, filling said trenches at least to the upper surface of said upper etch stop layer;

planarizing said metallization layer to remove the excess of said metallization layer forming a continuous bonding pad within said bonding pad area and including said plurality of adjacent dummy plugs; and forming at least one dual damascene structure including said at least one respective active interconnect;

forming a planarized passivation layer over said semiconductor structure; and patterning said passivation layer to expose said bonding pad area.

14. The method of claim 13, wherein said first width of each said active interconnect is less than said second width of each said dummy plug.

15. The method of claim 13, wherein said first width of each said active interconnect is greater than said second width of each said dummy plug.

16. The method of claim 13, wherein said etch stop layers are comprised of a material selected from the group silicon nitride, SiC, and $SiO_2$; said dielectric layers are comprised of a material selected from the group silicon oxide, FSG, and low-k materials such as fluorinated poly (arylene ether); and said passivation layer is comprised of a material selected from the group silicon nitride, SiC, $SiO_2$, a low-k material and SOG.

17. The method of claim 13, wherein said active interconnect and said dummy plugs are comprised of a metal selected from the group tungsten, copper, and aluminum; and said metallization layer is comprised of a material selected from the group copper, tungsten, aluminum, and an aluminum alloy.

18. The method of claim 13, wherein said active interconnect and said dummy plugs are comprised of tungsten and said metallization layer is comprised of copper.

19. The method of claim 13, wherein said etch stop layers are comprised of a material selected from the group silicon nitride, SiC, and $SiO_2$; said dielectric layers are comprised of a material selected from the group silicon oxide, FSG, and a low-k material; said passivation layer is comprised of a material selected from the group silicon nitride, $SiO_2$, SOG, and a low-k material; said active interconnect and said dummy plugs are comprised of a metal selected from the group tungsten, copper, and aluminum; and said metallization layer is comprised of a material selected from the group copper, tungsten, aluminum, and an aluminum alloy.

20. The method of claim 13, wherein said etch stop layers are comprised of silicon nitride; said dielectric layers are comprised of silicon oxide; said passivation layer is comprised of silicon nitride; said active interconnect and said dummy plugs are comprised of tungsten; and said metallization layer is comprised of copper.

21. The method of claim 13, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step.

22. The method of claim 13, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step; wherein said barrier layer includes a barrier layer portion and a seed layer portion over said barrier layer portion.

23. The method of claim 13, wherein said metal layer planarization step is conducted by chemical mechanical polishing.

24. A method of fabricating a semiconductor wafer having at least one integrated circuit, the method comprising the steps of:

providing a semiconductor structure having an upper surface with a semiconductor wafer etch stop layer over said upper surface, a lower dielectric layer over said semiconductor wafer etch stop layer, a lower etch stop layer over said lower dielectric layer, an upper dielectric layer over said lower etch stop layer, and an upper etch stop layer over said upper dielectric layer; said semiconductor structure having a bonding pad area and a interconnect area; said etch stop layers comprising silicon nitride and said dielectric layers comprising silicon dioxide;

forming, in a single etch step, at least one active tungsten interconnect in said interconnect area through said upper etch stop layer, upper dielectric, lower etch stop layer, lower dielectric, and semiconductor wafer etch stop layer, and a plurality of adjacent dummy tungsten plugs in said bonding pad area and through said upper etch stop, upper dielectric and lower etch stop layers and at least partially into said lower dielectric; said at least one active interconnect being arranged to electrically couple associated elements of an associated integrated circuit on the wafer, and said dummy plugs not being arranged to electrically couple any associated elements of any associated integrated circuit on the wafer;

patterning and etching said semiconductor structure to form trenches through said upper etch stop layer and said upper dielectric layer to said lower etch stop layer; said trenches surrounding each of said at least one active interconnect and said dummy plugs whereby said upper etch stop layer and said upper dielectric level between said adjacent dummy plugs is removed;

depositing a copper metallization layer over said etched upper etch stop layer and said upper dielectric layer, filling said trenches at least to the upper surface of said upper etch stop layer;

planarizing said copper metallization layer to remove the excess of said copper metallization layer forming a continuous bonding pad within said bonding pad area and including said plurality of adjacent dummy plugs; and forming at least one dual damascene structure including said at least one respective active interconnect;

forming a planarized silicon nitride passivation layer over said semiconductor structure; and patterning said silicon nitride passivation layer to expose said bonding pad area.

25. The method of claim 24, wherein said first width of each said active interconnect is less than said second width of each said dummy plug.

26. The method of claim 24, wherein said first width of each said active interconnect is greater than said second width of each said dummy plug.

27. The method of claim 24, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step.

28. The method of claim 24, further including the steps of forming a barrier layer between said at least one active interconnect and said upper and lower dielectric layers; and between said dummy plugs and said upper dielectric layer and said portion of said lower dielectric layer before said single etch step active interconnect and dummy plugs formation step; wherein said barrier layer includes a barrier layer portion and a seed layer portion over said barrier layer portion.

29. A method of fabricating a semiconductor wafer having at least one integrated circuit, the method comprising the steps of:

providing a semiconductor wafer structure having at least an upper and a lower dielectric layer, each covered by respective etch stop layers, over a semiconductor structure etch stop layer over the semiconductor structure; said semiconductor wafer structure having a bonding pad area and a interconnect area;

forming, at least one active interconnect having a first width, in said interconnect area, through said dielectric layers and said etch stop layers, and a plurality of adjacent dummy plugs each having a second width, in said bonding pad area, through a portion of said dielectric layers and the uppermost etch stop layer, stopping on the etch stop layer immediately beneath said uppermost etch stop layer; said first width of said active interconnect being greater than said second width of said adjacent dummy plugs;

patterning and etching said semiconductor wafer structure to form trenches through said top etch stop layer and said upper dielectric layer to said upper etch stop layer; said trenches surrounding each of said at least one active interconnect and said dummy plugs whereby said top etch stop layer and said upper dielectric level between said adjacent dummy plugs is removed;

depositing a metallization layer over said etched top etch stop layer and said upper dielectric layer, filling said trenches at least to the upper surface of said top etch stop layer; and planarizing said metallization layer to remove the excess of said metallization layer forming a continuous bonding pad within said bonding pad area and including said plurality of adjacent dummy plugs; and forming at least one dual damascene structure including said at least one respective active interconnect.

* * * * *